United States Patent
Weicker et al.

(10) Patent No.: US 10,436,845 B2
(45) Date of Patent: Oct. 8, 2019

(54) ELECTRIC VEHICLE BATTERY MONITORING SYSTEM

(71) Applicant: Faraday&Future Inc., Gardena, CA (US)

(72) Inventors: Phillip John Weicker, Pasadena, CA (US); Garrett David Heinen, San Luis Obispo, CA (US)

(73) Assignee: FARADAY & FUTURE INC., Gardena, CA (US)

( * ) Notice: Subject to any disclaimer, the term of this patent is extended or adjusted under 35 U.S.C. 154(b) by 505 days.

(21) Appl. No.: 15/057,739

(22) Filed: Mar. 1, 2016

(65) Prior Publication Data
US 2017/0254858 A1 Sep. 7, 2017

(51) Int. Cl.
*G01R 31/36* (2019.01)
*G01R 31/3842* (2019.01)
*B60L 58/12* (2019.01)

(52) U.S. Cl.
CPC ........ *G01R 31/3648* (2013.01); *B60L 58/12* (2019.02); *G01R 31/3842* (2019.01)

(58) Field of Classification Search
CPC ........... G01R 31/3624; G01R 31/3651; G01R 31/3648; G01R 31/3644; G01R 31/3662
See application file for complete search history.

(56) References Cited

U.S. PATENT DOCUMENTS

| | | | | |
|---|---|---|---|---|
| 6,388,447 B1* | 5/2002 | Hall | ............ | H02J 7/0047 |
| | | | | 324/426 |
| 7,315,789 B2* | 1/2008 | Plett | ............ | G01R 31/3842 |
| | | | | 702/63 |
| 9,067,504 B1* | 6/2015 | Lee | ............ | B60L 11/1851 |
| 9,091,735 B2* | 7/2015 | Wang | ............ | G01R 31/367 |
| 9,784,794 B2* | 10/2017 | Itabashi | ............ | H01M 10/486 |
| 9,891,285 B2* | 2/2018 | Prasad | ............ | G01R 31/367 |
| 2005/0088145 A1* | 4/2005 | Loch | ............ | G01R 31/386 |
| | | | | 320/132 |
| 2008/0065336 A1 | 3/2008 | Seo et al. | | |
| 2010/0280777 A1* | 11/2010 | Jin | ............ | B60L 3/0046 |
| | | | | 702/63 |
| 2011/0148424 A1* | 6/2011 | Chiang | ............ | G01R 31/3842 |
| | | | | 324/427 |
| 2011/0208453 A1* | 8/2011 | Ci | ............ | G01R 31/367 |
| | | | | 702/63 |

(Continued)

OTHER PUBLICATIONS

International Search Report and Written Opinion dated Jun. 30, 2017 for corresponding PCT/US2017/020265, filed Mar. 1, 2017.

*Primary Examiner* — Jaehwan Oh
(74) *Attorney, Agent, or Firm* — Knobbe Martens Olson & Bear LLP

(57) ABSTRACT

Systems and methods for monitoring and controlling a battery are disclosed. Systems can include a battery having an output voltage and an output current when delivering power, a load driven by power delivered from the battery, battery output voltage and current sensing circuits, and processing circuitry coupled to the battery output voltage and current sensing circuits. The processing circuitry may be configured to obtain sensed battery output voltage and current values, and to estimate values for at least three battery state parameters by concurrently fitting the voltage and current values to at least two different equations.

27 Claims, 7 Drawing Sheets

(56) References Cited

U.S. PATENT DOCUMENTS

| | | | | |
|---|---|---|---|---|
| 2011/0309838 A1* | 12/2011 | Lin | H01M 10/48 | 324/427 |
| 2012/0041698 A1* | 2/2012 | Zhang | G01R 31/367 | 702/63 |
| 2012/0101674 A1* | 4/2012 | Wang | G01R 31/367 | 701/22 |
| 2012/0143542 A1* | 6/2012 | Wu | G01R 31/367 | 702/63 |
| 2013/0138369 A1* | 5/2013 | Papana | G01R 31/3644 | 702/63 |
| 2013/0169281 A1* | 7/2013 | Baba | G01R 31/382 | 324/426 |
| 2013/0185008 A1* | 7/2013 | Itabashi | H01M 10/486 | 702/63 |
| 2014/0244193 A1* | 8/2014 | Balasingam | G06F 17/5036 | 702/63 |
| 2014/0278167 A1 | 9/2014 | Frost et al. | | |
| 2014/0333317 A1* | 11/2014 | Frost | H01M 10/44 | 324/430 |
| 2015/0051853 A1* | 2/2015 | Baba | H01M 10/48 | 702/63 |
| 2015/0127280 A1* | 5/2015 | Baba | H01M 10/48 | 702/63 |
| 2015/0158395 A1 | 6/2015 | Li et al. | | |
| 2015/0197164 A1* | 7/2015 | Lee | B60L 58/13 | 701/22 |
| 2015/0260800 A1* | 9/2015 | Baba | H01M 10/48 | 702/63 |
| 2015/0301116 A1* | 10/2015 | Baker | G01R 31/367 | 702/63 |
| 2015/0321572 A1* | 11/2015 | Koch | B60L 58/10 | 701/22 |
| 2015/0326038 A1* | 11/2015 | Lee | H01M 10/48 | 320/134 |
| 2016/0001672 A1* | 1/2016 | Lee | B60L 11/1864 | 320/136 |
| 2016/0003912 A1* | 1/2016 | Iwane | H02J 7/0021 | 702/63 |
| 2016/0089994 A1* | 3/2016 | Keller | H02J 7/045 | 320/153 |
| 2016/0114696 A1* | 4/2016 | Eifert | B60L 11/1861 | 320/134 |
| 2016/0116542 A1* | 4/2016 | Baba | B60L 58/12 | 702/63 |
| 2016/0131714 A1* | 5/2016 | Kuusisto | B60L 58/12 | 702/63 |
| 2016/0209472 A1* | 7/2016 | Chow | B60L 58/12 | |
| 2016/0252585 A1* | 9/2016 | Baba | H01M 10/48 | 702/63 |
| 2017/0082695 A1* | 3/2017 | Heinen | G01R 31/386 | |

* cited by examiner

ELECTRIC VEHICLE BATTERY MONITORING SYSTEM

BACKGROUND

Field

This disclosure relates to vehicle battery systems, and more specifically to systems and methods for monitoring and controlling high voltage batteries of an electric vehicle.

Description of the Related Art

Electric vehicles generally use one or more electric motors for propulsion and are powered by a battery system. Such vehicles include road and rail vehicles, surface and underwater vessels, electric aircraft, and electronic recreational devices. Electric vehicles release zero air pollutants and generate less noise than conventional combustion engine vehicles. Currently, lithium-ion batteries are often used. Battery performance may vary during use due to battery polarization or decreased charge state.

SUMMARY

The systems and methods of this disclosure each have several innovative aspects, no single one of which is solely responsible for its desirable attributes. Without limiting the scope as expressed by the claims that follow, its more prominent features will now be discussed briefly.

In one embodiment, a battery powered apparatus is described. The apparatus may include a battery including one or more electrochemical cells and having an output voltage and an output current when delivering power. The apparatus may further include a load driven by power delivered from the battery, a battery output voltage sensing circuit, a battery output current sensing circuit, and processing circuitry coupled to the battery output voltage sensing circuit and the battery output current sensing circuit. The processing circuitry may be configured to obtain sensed battery output voltage values and sensed battery output current values at defined intervals and to estimate values for at least three battery state parameters at particular times when the battery is delivering power to the load. Each of the at least three battery state parameters may vary over time as the battery is used to drive the load. Estimating the at least three battery state parameters may comprise concurrently fitting sensed battery output voltage values and sensed battery output current values and/or data derived using the sensed battery output voltage values and sensed battery output current values to at least two different equations, wherein each of the at least two different equations are defined at least in part by different subsets of the at least three battery state parameters.

In another embodiment, a method of operating a battery powered apparatus is described. The method may comprise driving a load of the apparatus with a battery, sensing the output voltage and output current of the battery at defined intervals while driving the load, and using the sensed battery output voltage values and sensed battery output current values to estimate values for at least three battery state parameters at particular times when the battery is driving the load. Each of the at least three battery state parameters may vary over time as the battery is used to drive the load. The estimating the at least three battery state parameters may comprise fitting sensed battery output voltage values and sensed battery output current values and/or data derived from the sensed battery output voltage values and sensed battery output current values to at least two different equations, wherein each of the at least two different equations are defined at least in part by different subsets of the at least three battery state parameters.

In another embodiment, an electric vehicle with a battery monitoring system is described. The vehicle may include a battery, a powertrain having at least one electric motor driven by the battery, a battery output voltage sensing circuit, a battery output current sensing circuit, and processing circuitry coupled to the battery output voltage sensing circuit and the battery output current sensing circuit. The processing circuitry may be configured to obtain sensed battery output voltage values and sensed battery output current values at defined intervals and to estimate values for at least three battery state parameters at particular times when the battery is delivering power to the powertrain. Each of the at least three battery state parameters may vary over time as the battery is used to drive the powertrain. Estimating the at least three battery state parameters may comprise concurrently fitting sensed battery output voltage values and sensed battery output current values and/or data derived from the sensed battery output voltage values and sensed battery output current values to at least two different equations, wherein each of the at least two different equations are defined at least in part by different subsets of the at least three battery state parameters.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations are merely examples and are not intended to be limiting. Throughout the drawings, similar symbols typically identify similar components, unless context dictates otherwise.

DETAILED DESCRIPTION

Figure 1:
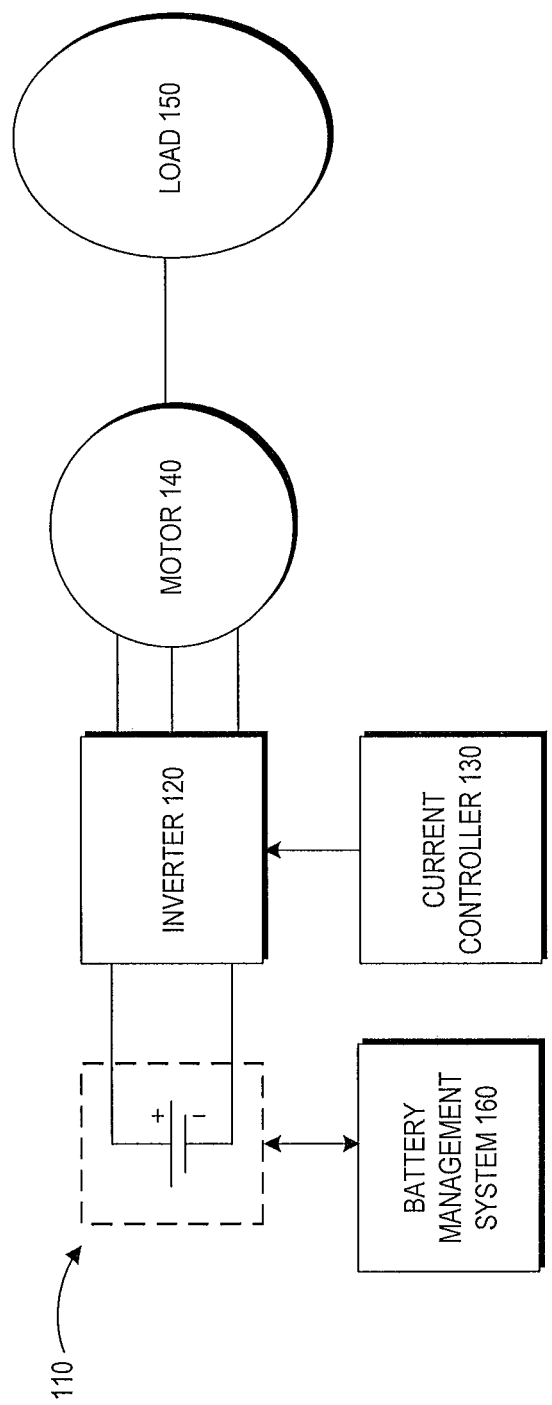
FIG. 1 is a block diagram of an example electric vehicle drive system according to one embodiment.

The following description is directed to certain implementations for the purpose of describing the innovative aspects of this disclosure. However, a person having ordinary skill in the art will readily recognize that the teachings herein can be applied in a multitude of different ways. In some implementations, the word "battery" or "batteries" will be used to describe certain elements of the embodiments described herein. It is noted that "battery" does not necessarily refer to only a single battery cell. Rather, any element described as a "battery" or illustrated in the Figures as a single battery in a circuit may equally be made up of any larger number of individual battery cells and/or other elements without departing from the spirit or scope of the disclosed systems and methods.

Electric vehicles typically include a high voltage battery system having significant energy and power storage capacity, suitable for powering electric traction motors. In addition to powering the vehicle's propulsion motors, the high voltage batteries' output may be stepped down using one or more DC-to-DC converters to power some or all of the other vehicle systems, such as interior and exterior lights, power assisted braking, power steering, infotainment, automobile diagnostic systems, power windows, door handles, and various other electronic functions when the high voltage batteries are engaged. Lithium-ion batteries are frequently used in the high voltage battery systems of electric vehicles. An electric vehicle may have a battery pack comprising a number of individual lithium-ion cells, which may be connected in a combination of parallel and series connections in order to provide sufficient voltage and energy capacity to power the systems described above.

During operation of an electric vehicle, it is important to monitor the state of the high voltage battery pack for a variety of reasons. Monitoring the state of charge (SOC) of the battery pack allows the vehicle to determine an estimate of the remaining mileage that can be traveled before recharging the batteries, and this range estimate can be delivered to the user. The inability of the battery to hold and deliver charge at a desirable rate may indicate that battery maintenance is required. In addition, the state of the battery can determine an instantaneous power limit, which may affect the ability of the battery to provide the necessary currents for certain high torque requests. Thus, knowledge of the power limit can allow the vehicle to determine an appropriate accelerator pedal map that correlates pedal position with motor torque commands and adjust the pedal map as necessary.

Battery state monitoring in such an environment is challenging because a lithium-ion battery pack does not behave as an ideal battery cell. Among the most salient differences between real and ideal batteries are the polarization and internal resistance present in real batteries. To accurately analyze the effects of polarization and internal resistance, a lithium-ion battery cell or group of cells may be represented by an equivalent circuit. In the case of electrochemical cells, an equivalent circuit is a theoretical circuit that uses a particular configuration of ideal electrical circuit elements to approximate the observed behavior of physical battery components.

FIG. 1 depicts a block diagram of an example electric vehicle drive system 100 including a battery management system 160. The electric vehicle drive system 100 includes the battery or voltage source 110, an inverter 120 coupled to the battery 110, a current controller 130, a motor 140, and load 150, and the battery management system 160. The battery 110 can be a single phase direct current (DC) source. In some embodiments, the battery 110 can be a rechargeable electric vehicle battery or traction battery used to power the propulsion of an electric vehicle including the drive system 100. Although the battery 110 is illustrated as a single element in FIG. 1, the battery 110 depicted in FIG. 1 is only representational, and further details of the battery 110 are discussed below in connection with FIG. 2.

The inverter 120 includes power inputs which are connected to conductors of the battery 110 to receive, for example, DC power, single-phase electrical current, or multi-phase electrical current. Additionally, the inverter 120 includes an input which is coupled to an output of the current controller 130, described further below. The inverter 120 also includes three outputs representing three phases with currents that can be separated by 120 electrical degrees, with each phase provided on a conductor coupled to the motor 140. It should be noted that in other embodiments inverter 120 may produce greater or fewer than three phases.

The motor 140 is fed from voltage source inverter 120 controlled by the current controller 130. The inputs of the motor 140 are coupled to respective windings distributed about a stator. The motor 140 can be coupled to a mechanical output, for example a mechanical coupling between the motor 140 and mechanical load 150. Mechanical load 150 may represent one or more wheels of the electric vehicle.

Controller 130 can be used to generate gate signals for the inverter 120. Accordingly, control of vehicle speed is performed by regulating the voltage or the flow of current from the inverter 120 through the stator of the motor 140. There are many control schemes that can be used in the electric vehicle drive system 100 including current control, voltage control, and direct torque control. Selection of the characteristics of inverter 120 and selection of the control technique of the controller 130 can determine efficacy of the drive system 100.

The battery management system 160 can receive data from the battery 110 and generate control signals to manage the battery 110. As will be described further below, the battery management system 160 may also generate battery state parameters that may be used to control the operation of the electric vehicle.

Figure 2:
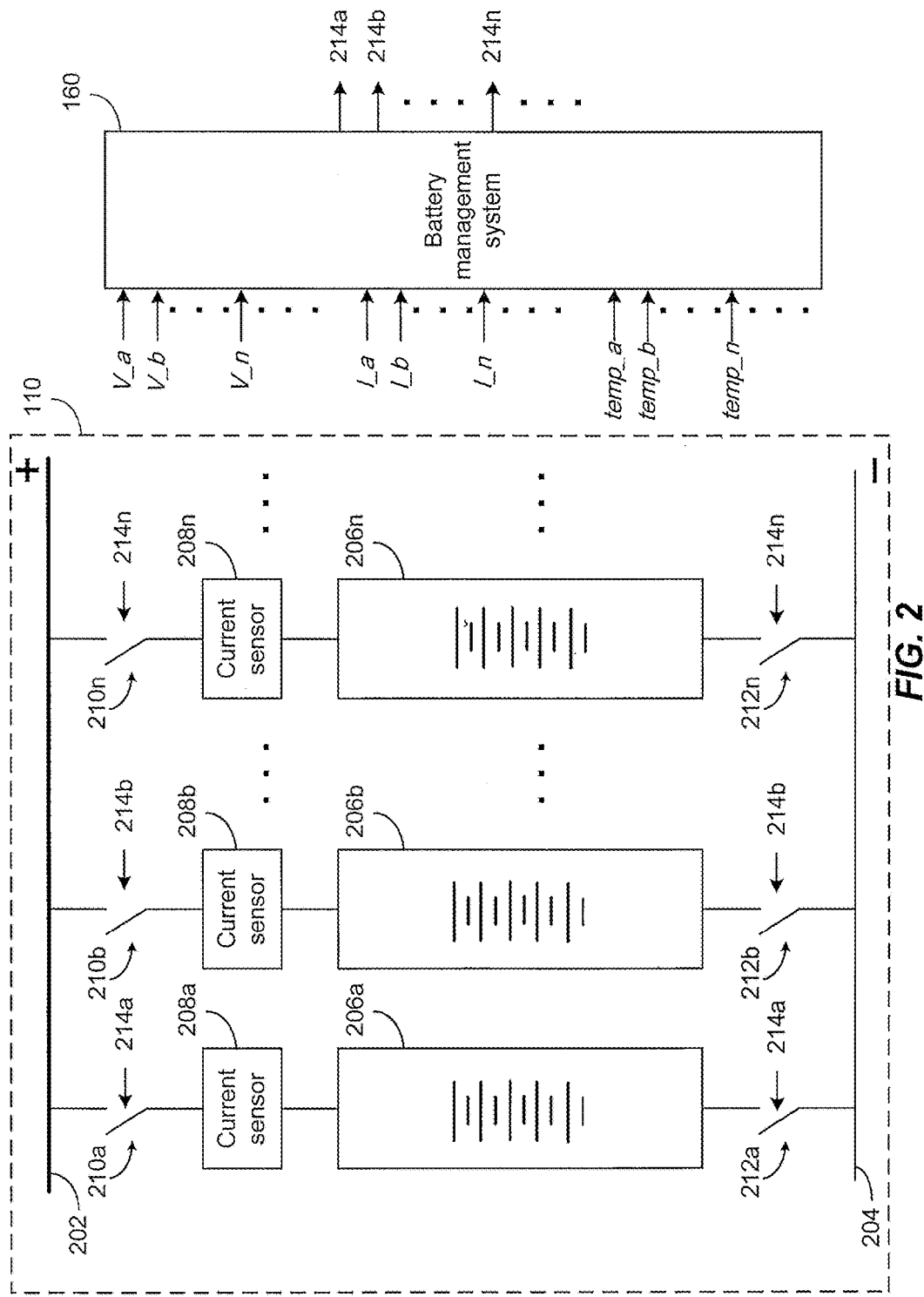
FIG. 2 is block diagram of example voltage source and battery management system according to one embodiment.

FIG. 2 is a block diagram of an example voltage source according to one embodiment. The voltage source 110 can include a plurality of battery strings 206a, 206b, ... 206n, ..., individually or collectively referred to herein as the battery string(s) 206, and a plurality of current sensors 208a, 208b, ..., 208n, ..., individually or collectively referred to herein as the current sensor(s) 208. The battery strings 206 can be individually connected to or disconnected from a positive or high power bus 202 and a negative or low power bus 204 through a plurality of switches 210a, 210b, ..., 210n, ..., and 212a, 212b, ..., 212n, ..., individually or collectively called the switches 210 and 212. The switches 210 and 212 can be controlled by control signals from a battery management system 160. The battery management system 160 can receive, among others, voltages, V_a, V_b, ..., V_n, ..., which are output voltages across the respective battery strings 206a, 206b, ..., 206n, ..., determined using, for example a plurality of sensors (not shown). The battery management system 160 can also receive currents, I_a, I_b, ..., I_n, ..., which are currents from the respective battery strings 206a, 206b, ..., 206n, ..., measured by the respective current sensors 208a, 208b, ..., 208n, .... The battery management system 160 also can receive temperature measurements, temp_a, temp_b, ..., temp_n, ..., which are one or more of temperature measurements from the respective battery strings 206a, 206b, ... 206n, ..., measured by one or more temperature sensors (not shown) accompanying the battery strings. Based at least in part on the voltages, V_a, V_b, ..., V_n, ..., currents, I_a, I_b, ..., I_n, ..., and/or temperatures, temp_a, temp_b, ..., temp_n, of the respective battery strings 206, the battery management system 160 can generate control signals 214a, 214b, ..., 214n, ..., individually or collectively referred to herein as the control signal(s) 214, for controlling the respective switches 210 and 212.

The battery strings 206 can include a plurality of modules, each of which in turn can include a plurality of cells. Within each battery string 206, the constituent modules and cells can be connected in series as symbolically depicted in FIG. 2. In some embodiments, the voltage source 110 can include six battery strings 206 that can be connected to or disconnected from the power buses 202, 204. The battery strings 206 can be implemented with various different types of rechargeable batteries made of various materials, such as lead acid, nickel cadmium, lithium ion, or other suitable materials. In some embodiments, each of the battery strings can output about 375V-400V if charged about 80% or more.

The current sensors 208 can be connected in series with the respective battery strings 206 between the high and low power buses 202, 204. As shown in FIG. 2 the current sensor 208 can be connected to the positive side of the respective battery strings 206 to measure the current discharged from the battery strings 206. In other embodiments, the current sensors 208 can be connected to the battery strings 206 otherwise to measure the current flow due to discharging of the battery strings 206. The current sensors 206 can be implemented as hall effect sensors, series shunts, or any other known current measurement device.

The switches 210 and 212 can be contactors configured to connect the battery strings 206 to the power buses 202, 204 or disconnect the battery strings 206 from the power buses 202, 204 in response to the respective control signals 214. The switches 210 can be implemented with any suitable contactors capable of handling the level of current and voltage as needed in connection with, for example, the battery strings 206, the power buses 202, 204, and the load 150 (FIG. 1) within the electric vehicle drive system 100 (FIG. 1). In some embodiments the switches 210 and 212 can be implemented with mechanical contactors with solenoid inside. In some embodiments, the switches 210 can be powered by one or more drivers in the battery management system 160. Although in the illustrated example in FIG. 2, the switches 210 (e.g., 210n) and the switches 212 (e.g., 212n) are controlled by the same respective control signals 214 (e.g., 214n), in other embodiments, the switches 210 (e.g., 210n) can be controlled by respective positive bus connect control signals while the switches 212 (e.g., 212n) can be controlled by respective negative bus connect control signals.

The battery management system 160 can include a plurality of passive and/or active circuit elements, signal processing components, such as analog-to-digital converters (ADCs), amplifiers, buffers, drivers, regulators, or other suitable components to, for example, sample and digitize the signals received by the battery management system. In some embodiments, the battery management system 160 can also include one or more processors to process incoming data to generate outputs, such as the control signals 214. In some embodiments, the battery management system 160 can also include one or more components for communicating and sending and receiving data within the battery management system 160 and/or with other components or circuitries in the electric vehicle. For example, the various components and circuits within the system 100, including components in the battery management system 160 can be in communication with one another using protocols or interfaces such as a CAN bus, SPI, or other suitable interfaces. And in some embodiments, the processing of incoming data can be at least in part performed by other components not in the battery management system 160 within the electric vehicle as the battery management system 160 communicates with other components.

Figure 3:
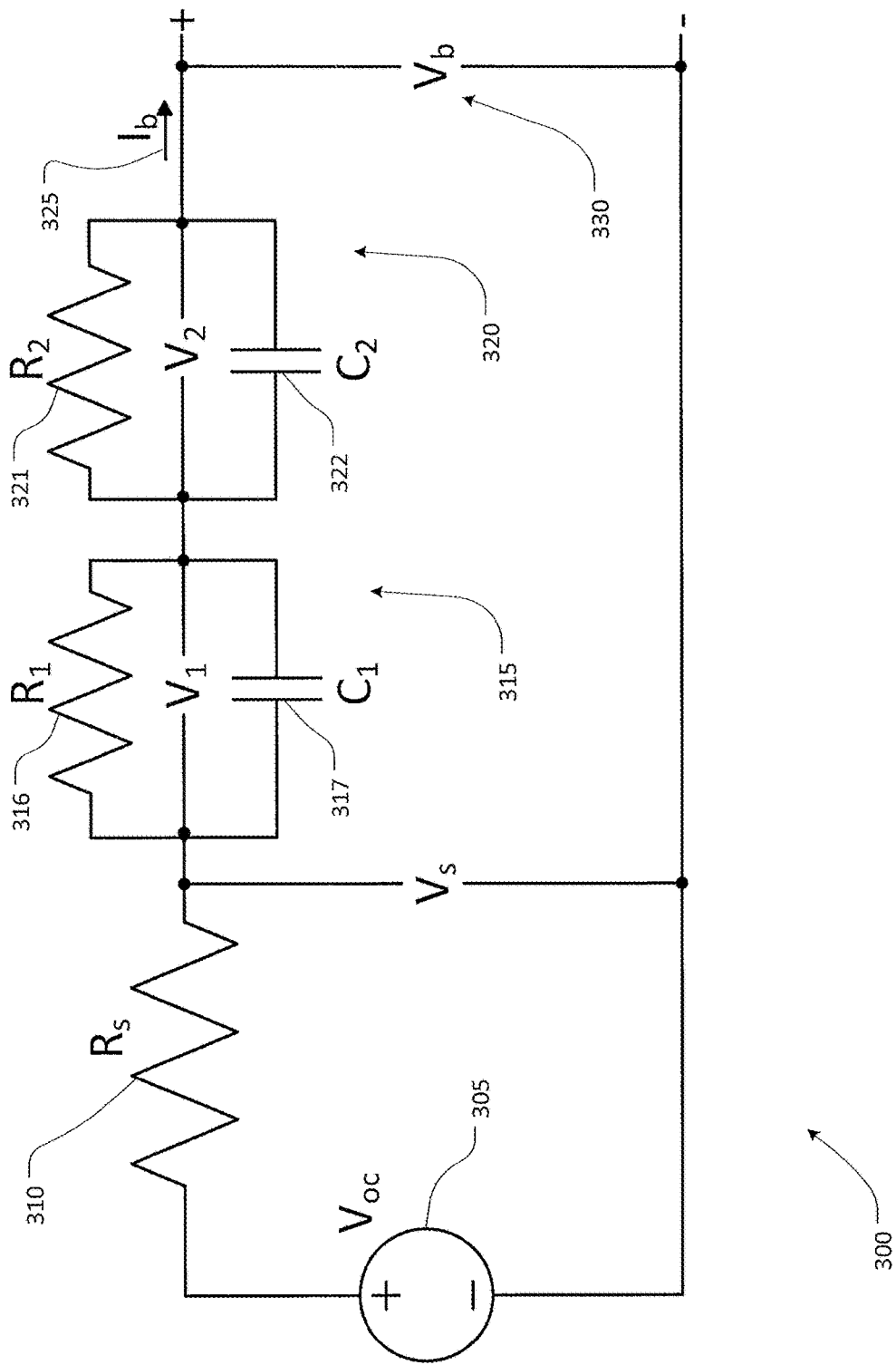
FIG. 3 is a circuit diagram depicting an equivalent circuit for the dual polarization model of a lithium ion battery cell in accordance with an exemplary embodiment.

FIG. 3 is a circuit diagram depicting an equivalent circuit 100 for the dual polarization model of a lithium-ion battery cell in accordance with an exemplary embodiment. The equivalent circuit 100 comprises an open circuit voltage $V_{oc}$ 105, which may be indicative of the actual charge state of the battery and a series resistance $R_s$ 110 representing the general internal resistance of the battery, which may be indicative of battery health. The equivalent circuit 100 further comprises two RC pairs 115 and 120 connected in series with $V_{oc}$ 105 and $R_s$ 110. The first RC pair 115 represents the observed effects of electrochemical polarization, and comprises a first resistance $R_1$ 116 and a first capacitance $C_1$ 117 in parallel with $R_1$ 116. The second RC pair 120 represents the observed effects of concentration polarization, and comprises a second resistance $R_2$ 121 and a second capacitance $C_2$ 122 in parallel with $R_2$ 121. Accordingly, this equivalent circuit 100 for a lithium-ion battery is known as a dual polarization (DP) model because the electrochemical polarization and the concentration polarization are represented by separate circuit elements.

Because the equivalent circuit 100 is a model designed to exhibit the same behavior as a physical battery, the voltage source, resistors, and capacitors depicted are not physically present as discrete elements, but rather form a circuit that has been found to behave like a physical battery. With different physical batteries, or as a single given physical battery changes state over time or with aging, stored charge, and the like, the numerical values of the model circuit elements change, but the topology of the circuit itself retains its character as a relatively accurate representation of battery behavior. Accordingly, numerical values for the parameters $V_{oc}$ 105, $R_s$ 110, $R_1$ 116, $C_1$ 117, $R_2$ 121, and $C_2$ 122 for a particular battery at a particular time may be determined based on physical parameters that may be measured for the battery, such as the total battery output current $I_b$ 125 and the total output voltage across the terminals $V_b$ 130. Parameter values may be determined based on observed values of $I_b$ 125 and $V_b$ 130 over time during operation of the battery. For purposes of calculation described below, a series voltage $V_s$, equal to the total voltage difference across the open circuit voltage 105 and the series resistance, may be defined. Similarly, $V_1$ may be defined as the voltage drop across the first RC pair, and $V_2$ may be defined as the voltage drop across the second RC pair.

Solving for the six parameter values based on measurements of $I_b$ 125 and $V_b$ 130 is a complicated process because it involves six degrees of freedom. One method of determining parameter values for a lithium-ion battery is to use a frequency response analyzer, which stimulates the battery with AC current over a wide range of frequencies in order to generate accurate models of the battery. However, it would be impractical to incorporate a frequency response analyzer into an electric vehicle for onboard battery monitoring for a number of reasons. In addition to adding complexity to the vehicle design, a frequency response analyzer could add many thousands of dollars to the cost of the vehicle. Moreover, testing with a frequency response analyzer requires an accurate source of high-frequency AC current, which is difficult to provide in a DC battery-powered electric vehicle.

Mathematical algorithms have also been developed to attempt to estimate numerical values for the six parameters based on observed values of $I_b$ 125 and $V_b$ 130 during battery operation. One commonly used algorithm is the extended Kalman filter, which uses a nonlinear optimization method to determine values for the parameters. However, the extended Kalman filter method is often inaccurate and/or unstable. In addition, the method is computationally intensive because it attempts to optimize a system with six degrees of freedom. Thus, even if accuracy could be improved, the extended Kalman filter is not suitable for use in onboard battery diagnostics, as real time or near-real time determination of the six DP model parameters is required for safe and effective battery control.

In contrast to the difficult six-degree optimization problem described above, implementations of battery monitoring described herein take advantage of the fact that lower-order problems are easier to solve and may be computed more accurately and with more numerical stability, allowing their use in onboard diagnostics for battery monitoring and control. In most cases, solving a single n-dimensional problem is harder than solving m problems of n/m dimensions, where m|n. In the case of the 6-dimensional DP equivalent circuit, it is easier to solve three 2-dimensional problems. Thus, the novel systems and methods disclosed herein allow for accurate and efficient battery monitoring and control based on solving the 6-dimensional DP equivalent circuit as 3 related 2-dimensional equations.

Methods for solving for the six parameters of the equivalent circuit may begin by separating the DP equivalent circuit into three parts for analysis, described by the equations:

$$(V_s) = R_s(I_b) + V_{oc} \tag{1}$$

$$\left(\frac{\int I_b}{V_1}\right) = \frac{1}{R_1}\left(\frac{\int V_1}{V_1}\right) + C_1 \tag{2}$$

$$\left(\frac{\int I_b}{V_2}\right) = \frac{1}{R_2}\left(\frac{\int V_2}{V_2}\right) + C_2 \tag{3}$$

Equation (1) defines the series voltage $V_s$ in terms of the total battery current $I_b$ 325 and a subset of two of the six parameters: $R_s$ 310 and $V_{oc}$ 305. Equation (2) relates the total battery current $I_b$ 325 to $V_1$, using a different subset of two of the six parameters defining the first RC pair. Equation (3) is similar to equation (2), using another subset of two of the six parameters defining the second RC pair to relate the total battery current 325 to $V_2$. Thus, this division into three equations allows each equation to be solved with only two degrees of freedom. Notably, each of the three equations is a linear equation, of the standard form (y)=m(x)+b, which may be solved quickly, accurately, and repeatedly as described below.

One advantage to the three equations illustrated above in the contect of battery monitoring is that it separates into separate equations the variables that tend to vary within similar time scales. For a typical lithium-ion battery, $V_{oc}$ and $R_s$ tend to vary the fastest, over time scales similar to charge and discharge cycles. Changes in $R_2$ and $C_2$ tend to be driven more by long term battery aging, and $R_1$ and $C_1$ are generally somewhere in between. This improves the accuracy and stability of the estimation process.

Figure 4:
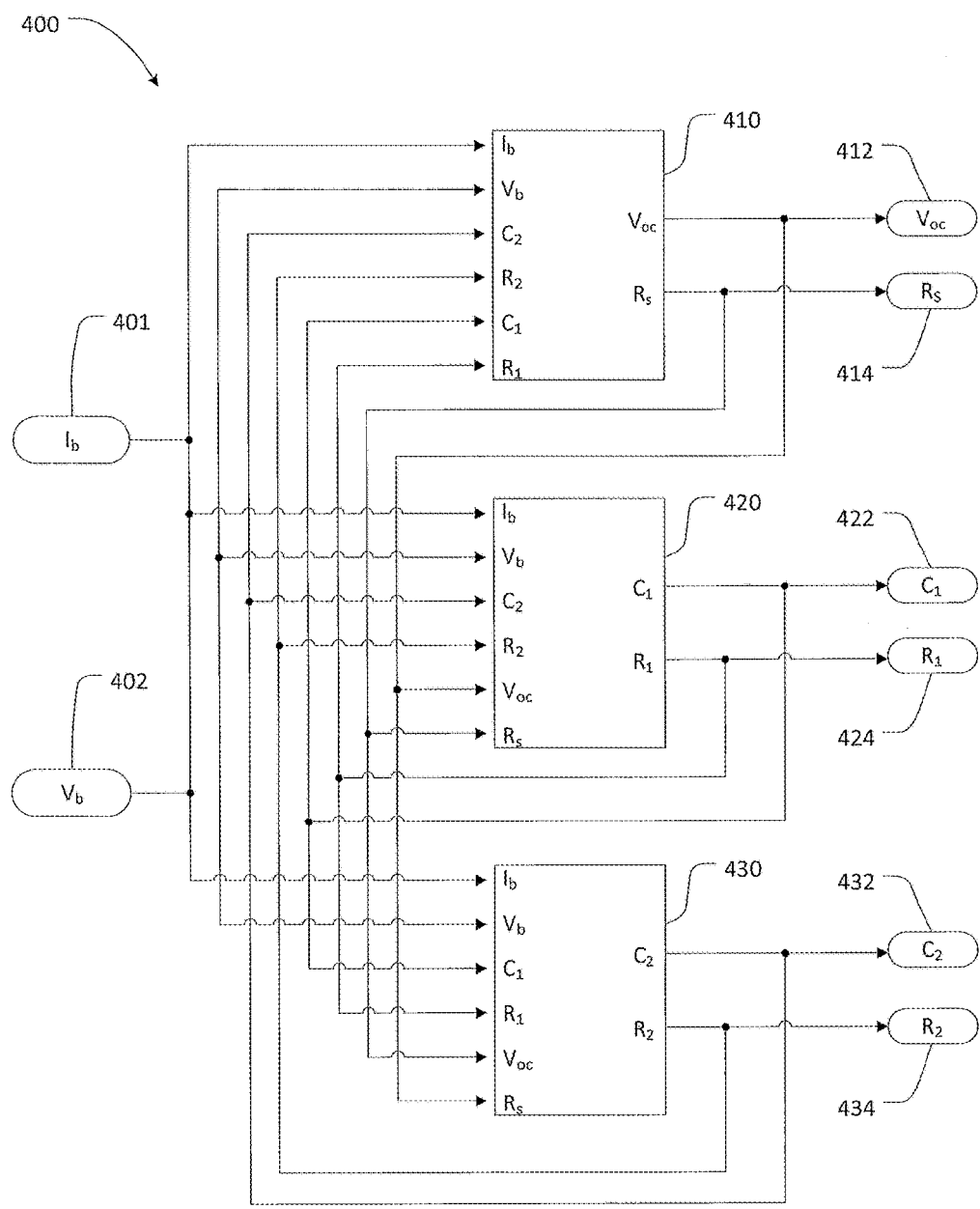
FIG. 4 is a schematic diagram depicting a system configured to carry out a multiple linear recursive least squares solution method for six battery state parameters in accordance with an exemplary embodiment.

FIG. 4 is a schematic diagram depicting a system 400 configured to carry out a multiple linear recursive least squares solution method for six battery state parameters in accordance with an exemplary embodiment. As described above, the system 400 receives as inputs only the total battery output current $I_b$ 401 and battery output voltage $V_b$ 402. The battery output current $I_b$ 401 may be received from a current sensing circuit within or near the battery, such as in a bus bar or other transmission path that ordinarily carries the full output current of the battery. The current sensing circuit may be a current detecting shunt apparatus, an ammeter, a hall effect sensor, or the like. The battery output voltage $V_b$ 402 may be received from a voltage sensing circuit, such as a voltmeter or the like, connected between the positive and negative terminals of the battery. The battery output current and voltage sensing circuits may be configured to take repeated measurements at a predetermined sampling interval. The specific length of the interval is not of particular importance, but may, for example, be in the range of 100 microseconds to several seconds.

The system 400 comprises three estimating blocks 410, 420, and 430, and is configured to produce as outputs the six desired parameters of the DP equivalent circuit as described above: open circuit voltage 412, series resistance 414, first capacitance 422, first resistance 424, second capacitance 432, and second resistance 434. The system 400 is configured to be initiated with initial estimates for each of the six parameters. The initial parameter estimates may be determined based on laboratory testing of the battery before installation in the vehicle, or may be estimated based on experimentally determined parameters for another battery or batteries known to be composed of substantially similar materials and structure. As will be described in greater detail below, the system 400 may operate by repeatedly updating the values of each of the parameters based on newly received measured current 401 and voltage 402 values.

Each of the estimating blocks 410, 420, and 430 is configured to calculate two of the six output parameters, and receives the battery current 401 and voltage 402 as inputs. In addition, each of the blocks 410, 420, 430 receives as further inputs the four outputs of the two other blocks. More specifically, estimating block 410 receives as inputs the battery current 401, the battery voltage 402, and the outputs of estimating blocks 420 and 430 (i.e., current estimates of the first capacitance 422, first resistance 424, second capacitance 432, and second resistance 434 from the last iteration). Similarly, estimating block 420 receives as inputs the battery current 401, the battery voltage 402, the open circuit voltage 412 and series resistance 414 from estimating block 410, and the second capacitance 432 and second resistance 434 from estimating block 430. Estimating block 430 receives as inputs the battery current 401, the battery voltage 402, the open circuit voltage 412 and series resistance 414 from estimating block 410, and the first capacitance 422 and first resistance 442 from estimating block 420.

Figure 5A:
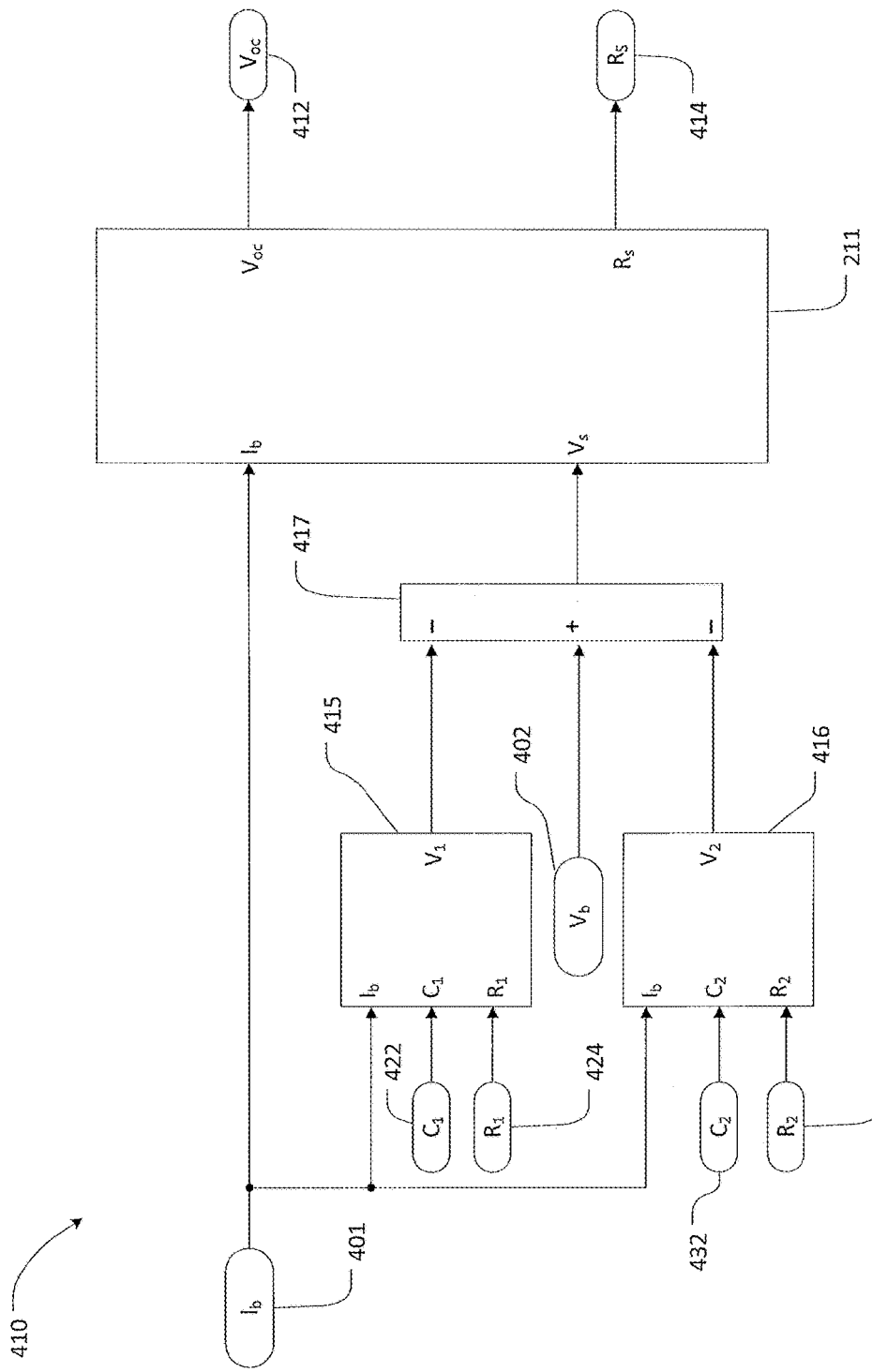
FIG. 5A is a schematic diagram depicting a configuration of a two-variable linear recursive least squares estimating circuit in accordance with an exemplary embodiment.

FIG. 5A is a schematic diagram depicting a configuration of the first two-variable linear recursive least squares estimating block 410 as depicted in FIG. 4 above. The estimating block 410 may be configured to generate values for $R_s$ and $V_{oc}$ that best fit (in a least square error sense) a series of input measurements of $I_b$ and $V_b$ using the equation:

$$(V_s)=R_s(I_b)+V_{oc} \tag{1}$$

Accordingly, the estimating circuit 410 receives inputs of the battery output current 401 and the battery output voltage 402 from the sensing circuitry described above. The estimating circuit receives the estimated first capacitance 422 and first resistance 424 from the outputs of the second estimating block 420 (not shown), as well as the second capacitance 432 and second resistance 434 from the third estimating block 430 (not shown).

To convert the inputs into the variables necessary to solve for the open circuit voltage 412 and the series resistance 414, the estimating block 410 comprises two RC pair calculation blocks 415 and 416 and a voltage addition/subtraction block 417. At the first RC pair calculation block 415, the voltage drop $V_1$ across the first RC pair is calculated based on the total battery current 401 and the current estimated values of $C_1$ 422 and $R_1$ 424. The voltage drop $V_2$ across the second RC pair is calculated similarly at the second RC pair calculation block 416. The RC pair voltages $V_1$ and $V_2$ are sent to the voltage addition/subtraction circuit 417, where they are subtracted from the total measured battery output voltage 402. Based on the DP equivalent circuit depicted in FIG. 1, this difference is equal to the voltage $V_s$, which is the output of the addition/subtraction circuit 417.

Final calculation of estimates of the desired output parameters 412 and 414 occurs at the recursive function block 411. At the recursive function block 411, the observed value of $I_b$ 401 and the calculated estimate of $V_s$ (which is derived from $I_b$ 401 and $V_b$ 402, using also existing estimates for the other parameters) are used to generate or update values for $R_s$ 414 and $V_{oc}$ 412. The recursive function block 411 may use any of various algorithms to generate and/or update estimates for $R_s$ 414 and $V_{oc}$ 412 based on new measured inputs. In some embodiments, adjustment of the stored parameter estimates may be based on only the most recent observed current and voltage data, or may attempt to find parameters that best fit any number of previously observed current and voltage sample data points. Fundamentally, the recursive function block finds the slope and intercept of a line that best fits one or more prior output current and voltage measurements of the battery, where in this case the slope corresponds to the series resistance parameter and the intercept corresponds to the open circuit voltage parameter. Many robust linear algebraic techniques for have been developed that solve these types of problems. These techniques may, for example, involve generating a matrix decomposition such as a singular value decomposition for a matrix inversion. Techniques such as these are well known for overdetermined variables, where there are more data points than variables, wherein a linear function is derived that best represents all the measured data, and such an algorithm can be applied to find values for $R_s$ 414 and $V_{oc}$ 412 that best fit a sequence of measurements of $I_b$ 401 and $V_b$ 402. Recursive algorithms are also well known to re-generate updated values for variables such as for $R_s$ 414 and $V_{oc}$ 412 as new measurement data is acquired that may be repeated indefinitely during the operation of the battery in order to accurately calculate and track changes in the battery parameters over the course of a battery cycle, a plurality of battery cycles, or the life of the battery.

After the recursive function box 411 updates the stored estimates of $R_s$ 414 and $V_{oc}$ 412, the estimates may be stored at the recursive function box 411 or in other memory circuitry (not shown) to serve as the stored estimates for the next iteration of the estimation process described above. In addition, the updated estimates of $R_s$ 414 and $V_{oc}$ 412 may be output to the other two estimation circuits 420 and 430, as shown in FIG. 4, to be used in their estimation processes as described below with reference to FIG. 5B.

Figure 5B:
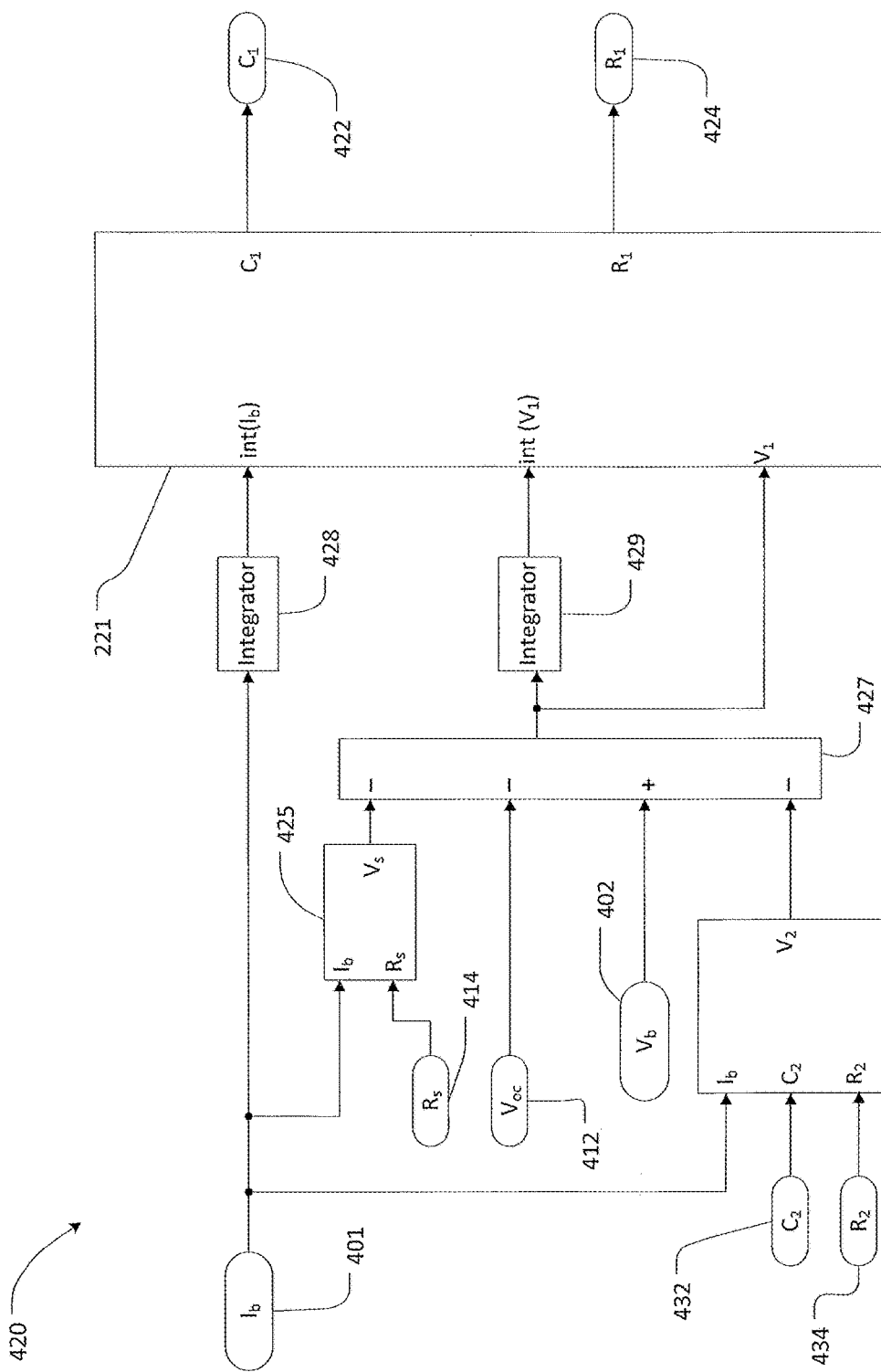
FIG. 5B is a schematic diagram depicting a configuration of a two-variable linear recursive least squares estimating circuit in accordance with an exemplary embodiment.

FIG. 5B is a schematic diagram depicting a configuration of the second two-variable linear recursive least squares estimating circuit 420 as depicted in FIG. 4 above. As in the estimating circuit 410 described above with reference to FIG. 5A, the final calculation occurs at a recursive function block 421. The recursive function block 421 preferably operates in much the same manner as the recursive function block 411 of the first estimating block 410, the only difference being that the recursive function block 421 evaluates the equation $$\left(\frac{\int I_b}{V_1}\right) = \frac{1}{R_1}\left(\frac{\int V_1}{V_1}\right) + C_1 \tag{2}$$

instead of equation (1), and generates an estimate of parameters $C_1$, the first capacitance 422 (the intercept of the best fit line), and $R_1$, the first resistance 424 (the reciprocal of the slope of the best fit line). Thus, the inputs to the second estimating circuit 420 include $I_b$ 401 and $V_b$ 402 from the sensing circuitry described above, $R_s$ and $V_{oc}$ from the outputs of the first estimating block 410, and $C_2$ and $R_2$ from the outputs of the third estimating block 430.

To optimize the values of $C_1$ 422 and $R_1$ 424 in equation (2), the voltage $V_2$ across the second RC pair is calculated at the RC pair calculation circuit 426 as described above with reference to RC pair calculation circuit 416 of FIG. 5A above. The voltage drop $V_s$ across the series resistance 310 as shown in FIG. 3 may be calculated at the resistor calculation circuit 425, where the total battery current 401 may be multiplied by the current estimated value of $R_s$ 414 to calculate $V_s$. The estimated $V_{oc}$ is already in the form of a voltage drop, and thus may be sent directly to the voltage addition/subtraction circuit 427 without any further processing.

The voltage addition/subtraction circuit 427 operates in much the same way as the addition/subtraction circuit 417 described above with reference to FIG. 5A. Here, the addition/subtraction circuit 427 is used to determine a value for $V_1$, the voltage across the first RC pair, by subtracting out the other three elements of the DP equivalent circuit depicted in FIG. 3. Thus, the series voltage drop $V_s$, the open circuit voltage 212, and the voltage $V_2$ across the second RC pair are subtracted from the total battery output voltage 402 to determine the estimated value of $V_1$.

Because equation (2) above requires as inputs $V_1$, the integral of $V_1$, and the integral of the total battery current 401, two integrators 428 and 429 may be included in the estimating circuit 420. Current integrator 428 receives the total battery current 401 as an input, and produces an output by performing a discrete-time integral or similar integration method. The $V_1$ integrator 429 performs the same process for $V_1$. Thus, the three required inputs for the recursive function block 421 are calculated. As described above, the recursive function box 421 may evaluate equation (2) based on stored estimates of $C_1$ 422 and $R_1$ 424 using an algorithm such as a recursive least squares method as described above, and may update the stored parameter estimates for $C_1$ 422 and $R_1$ 424.

After the recursive function block 221 updates the stored estimates of $C_1$ 422 and $R_1$ 424, the estimates may be stored at the recursive function block 421 or in other memory circuitry (not shown) to serve as the stored estimates for the next iteration of the estimated process described above. In addition, the updated estimates of $C_1$ 422 and $R_1$ 424 may be output to the other two estimation circuits 410 and 430, as shown in FIG. 4, to be used in their estimation processes. The operation of estimation circuit 430 is not separately depicted here, but operates in substantially the same manner as estimation circuit 420, except that $C_1$ and $R_1$ are among the inputs to estimation circuit 430, and $C_2$ and $R_2$ are the outputs of estimation circuit 430.

Figure 6:
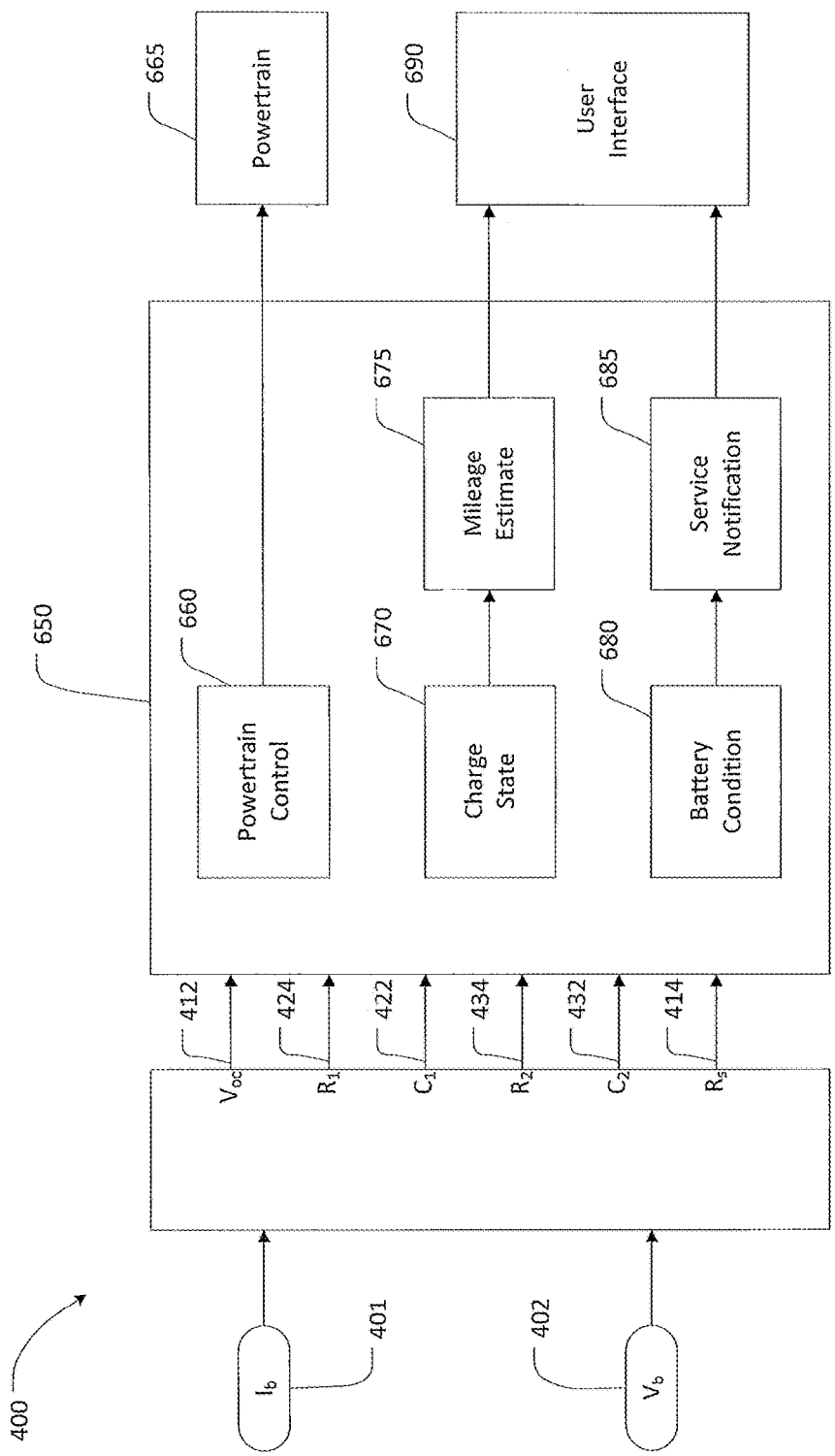
FIG. 6 is a block diagram depicting a vehicle battery monitoring and control system in accordance with an exemplary embodiment.

FIG. 6 is a block diagram depicting a vehicle battery monitoring and control system in accordance with an exemplary embodiment. The system may be a part of an electric or hybrid vehicle, and may include processing elements, a user interface, and a powertrain including a battery pack and one or more electric motors for propelling the vehicle. The battery monitoring and control system may include battery management system 160 (e.g. FIG. 2) that may include the solving system 400 as described above with reference to FIG. 4. The solving system 400 may comprise processing circuitry configured to use an iterative processing method as described above to derive the six desired battery state parameters, $V_{oc}$ 412, $R_1$ 424, $C_1$ 422, $R_2$ 434, $C_2$ 432, and $R_s$ 414, from inputs of battery output current 401 and battery output voltage 402. When these six battery state parameters are calculated, they may be sent to processing circuitry 650.

Processing circuitry 650 may include powertrain control circuitry 660 configured to control the vehicle's powertrain 665 based at least in part on the estimated battery state parameters. The processing circuitry 650 may further include charge state estimating circuitry 670 configured to determine the charge state of the battery pack and mileage estimate circuitry configured to determine an estimated remaining driving range based on the charge state of the battery pack. The processing circuitry 650 may include battery condition circuitry 680 configured to assess the condition or health of the battery pack and service notification circuitry 685 configured to determine when battery service is required based on the condition or health of the battery pack. The mileage estimate circuitry 675 and service notification circuitry 685 may further be configured to communicate with a user of the vehicle through a user interface 690 to indicate the remaining driving range and/or notify the user that battery service is required.

Powertrain control circuitry 660 may use some or all of the estimated battery state parameters to control the electric motors for vehicle propulsion. In some aspects, the powertrain control circuitry 660 may update or modify a pedal map based on the state of the battery. A pedal map can determine the amount of torque requested from the powertrain based on a position of the accelerator pedal depressed by a driver of the vehicle. For example, when the battery is fully charged and free of polarization, and a driver fully depresses the accelerator pedal, the maximum torque request may be transmitted to the powertrain. The powertrain may then determine the appropriate current levels to draw from the battery pack based on one or more lookup tables contained in processing or memory circuitry of the powertrain.

However, in some conditions, such as low charge state or significant polarization, the battery pack may have a diminished ability to produce torque in the one or more powertrain motors. Such conditions may be detectable by the powertrain control circuitry 660 based on the values of some or all of the battery state parameters. If a torque request sent to the powertrain is too large for the battery in its current charge state, the powertrain will seem to lose power, resulting in an unpleasant or possibly dangerous user experience. Instead, the powertrain control circuitry 660 may modify the powertrain's response to pedal inputs so as to avoid transmitting a torque request that the powertrain is unable to fulfill.

In some embodiments, the powertrain control circuitry 660 may calculate an instantaneous power limit based at least in part on the six battery state parameters, as well as other factors such as a desired minimum range. The powertrain control circuitry 660 may then translate the instantaneous power limit into a maximum allowable torque command, which may be set to correspond to the fully depressed position of the accelerator pedal of the vehicle. Finally, the torque commands corresponding to all intermediate positions of the accelerator pedal may be set as desired to values between zero and the maximum allowable torque command.

As described above, the solving methods used by the solving system 400 are iterative, and may repeatedly transmit updated estimates of the battery state parameters 412, 414, 422, 424, 432, and 434 to the processing circuitry 650. Thus, the powertrain control circuitry 660 may continuously and/or repeatedly update the pedal map based upon recalculated instantaneous power limits so as to optimize the performance of the vehicle powertrain. Similarly, the mileage estimate circuitry 670 may continuously and/or repeatedly recalculate the remaining driving range so that a user of the vehicle can remain aware of the remaining driving range in real time via the user interface 690. Repeated recalculation of the battery health by the battery condition circuitry 680 may allow for an immediate notification when the battery reaches a preset service requirement threshold, thereby avoiding potentially dangerous delays in required battery maintenance.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The foregoing description details certain embodiments of the systems, devices, and methods disclosed herein. It will be appreciated, however, that no matter how detailed the foregoing appears in text, the devices and methods can be practiced in many ways. As is also stated above, it should be noted that the use of particular terminology when describing certain features or aspects of the invention should not be taken to imply that the terminology is being re-defined herein to be restricted to including any specific characteristics of the features or aspects of the technology with which that terminology is associated. The scope of the disclosure should therefore be construed in accordance with the appended claims and any equivalents thereof.

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

It is noted that the examples may be described as a process. Although the operations may be described as a sequential process, many of the operations can be performed in parallel, or concurrently, and the process can be repeated. In addition, the order of the operations may be rearranged. A process is terminated when its operations are completed. A process may correspond to a method, a function, a procedure, a subroutine, a subprogram, etc.

The previous description of the disclosed implementations is provided to enable any person skilled in the art to make or use the present disclosed process and system. Various modifications to these implementations will be readily apparent to those skilled in the art, and the generic principles defined herein may be applied to other implementations without departing from the spirit or scope of the disclosed process and system. Thus, the present disclosed process and system is not intended to be limited to the implementations shown herein but is to be accorded the widest scope consistent with the principles and novel features disclosed herein.

What is claimed is:

1. A battery powered apparatus comprising:
    a battery comprising one or more electrochemical cells, the battery having an output voltage and an output current when delivering power;
    a load driven by power delivered from the battery;
    a battery output voltage sensing circuit;
    a battery output current sensing circuit; and
    processing circuitry coupled to the battery output voltage sensing circuit and the battery output current sensing circuit, the processing circuitry configured to obtain sensed battery output voltage values and sensed battery output current values at defined intervals and to estimate values for at least three battery state parameters of a plurality of battery state parameters at particular times when the battery is delivering power to the load, the plurality of battery state parameters including an open circuit voltage ($V_{oc}$), a series resistance ($R_s$), a first resistance ($R_1$), a first capacitance ($C_1$), a second resistance ($R_2$), and a second capacitance ($C_2$), wherein each of the at least three battery state parameters varies over time as the battery is used to drive the load;
    wherein estimating the at least three battery state parameters comprises concurrently fitting sensed battery output voltage values and sensed battery output current values and/or data derived using the sensed battery output voltage values and sensed battery output current values to at least two different equations, wherein each of the at least two different equations are defined at least in part by different subsets of the at least three battery state parameters.

2. The battery powered apparatus of claim 1, wherein one or more of the at least two different equations is a linear equation with a slope and an intercept defined at least in part by one or more of the at least three battery state parameters.

3. The battery powered apparatus of claim 1, wherein estimating comprises storing current estimated values for the at least three battery state parameters, obtaining additional sensed battery output voltage values and sensed battery output current values, and updating the current estimates of the at least three battery state parameters based at least in part on the additional sensed battery output voltage values and sensed battery output current values.

4. The battery powered apparatus of claim 1, wherein the estimation of at least one of the battery state parameters is dependent on the estimated value of at least one other battery state parameter.

5. The battery powered apparatus of claim 1, wherein the processing circuitry is configured to estimate values of at least six battery state parameters and wherein the at least two different equations include at least three linear equations.

6. The battery powered apparatus of claim 5, wherein the three linear equations comprise:

$$(V_s) = R_s(I_b) + V_{oc} \qquad (1)$$

$$\left(\frac{\int I_b}{V_1}\right) = \frac{1}{R_1}\left(\frac{\int V_1}{V_1}\right) + C_1 \qquad (2)$$

$$\left(\frac{\int I_b}{V_2}\right) = \frac{1}{R_2}\left(\frac{\int V_2}{V_2}\right) + C_2, \qquad (3)$$

wherein $R_s$, $V_{oc}$, $R_1$, $C_1$, $R_2$, and $C_2$ are components of a battery equivalent circuit, wherein $R_1$ and $C_1$ are components of a first series RC circuit and $R_2$ and $C_2$ are components of a second series RC circuit and wherein equations (2) and (3) are solved over a predetermined sampling time interval.

7. The battery powered apparatus of claim 1, wherein the at least three battery state parameters comprise an open circuit voltage of a battery equivalent circuit.

8. The battery powered apparatus of claim 7, wherein the processing circuitry is further configured to estimate a charge state of the battery based at least in part on the estimated open circuit voltage of the equivalent circuit.

9. A method of operating a battery powered apparatus, the method comprising:
    driving a load of the apparatus with a battery;
    sensing the output voltage and output current of the battery at defined intervals while driving the load;
    using the sensed battery output voltage values and sensed battery output current values to estimate values for at least three battery state parameters of a plurality of battery state parameters at particular times when the battery is driving the load, wherein each of the at least three battery state parameters varies over time as the battery is used to drive the load, the plurality of battery state parameters including an open circuit voltage ($V_{oc}$), a series resistance ($R_s$), a first resistance ($R_1$), a first capacitance ($C_1$), a second resistance ($R_2$), and a second capacitance ($C_2$), wherein the estimating the at least three battery state parameters comprises fitting sensed battery output voltage values and sensed battery output current values and/or data derived from the sensed battery output voltage values and sensed battery output current values to at least two different equations, wherein each of the at least two different equations are defined at least in part by different subsets of the at least three battery state parameters.

10. The method of claim 9, wherein one or more of the at least two different equations is a linear equation with a slope and an intercept defined at least in part by one or more of the at least three battery state parameters.

11. The method of claim 9, wherein estimating comprises storing current estimated values for the at least three battery state parameters, obtaining additional sensed battery output voltage values and sensed battery output current values, and updating the current estimates of the at least three battery state parameters based at least in part on the additional sensed battery output voltage values and sensed battery output current values.

12. The method of claim 9, wherein the estimation of at least one of the battery state parameters is dependent on the estimated value of at least one other battery state parameter.

13. The method of claim 9, further comprising estimating values for at least six battery state parameters using at least three linear equations.

14. The method of claim 9, further comprising using three linear equations for the at least two different equations, the three linear equations comprising:

$$(V_s) = R_s(I_b) + V_{oc} \quad (1)$$

$$\left(\frac{\int I_b}{V_1}\right) = \frac{1}{R_1}\left(\frac{\int V_1}{V_1}\right) + C_1 \quad (2)$$

$$\left(\frac{\int I_b}{V_2}\right) = \frac{1}{R_2}\left(\frac{\int V_2}{V_2}\right) + C_2, \quad (3)$$

wherein $R_s$, $V_{oc}$, $R_1$, $C_1$, $R_2$, and $C_2$ are components of a battery equivalent circuit, wherein $R_1$ and $C_1$ are components of a series RC circuit and $R_2$ and $C_2$ are components of a second series RC circuit and wherein equations (2) and (3) are solved over a predetermined sampling time interval.

15. The method of claim 9, wherein the at least three battery state parameters comprise an open circuit voltage of a battery equivalent circuit.

16. The method of claim 15, further comprising estimating a charge state of the battery based on the estimated open circuit voltage of the equivalent circuit.

17. An electric vehicle with a battery monitoring system, the vehicle comprising:
a battery;
a powertrain comprising at least one electric motor driven by the battery;
a battery output voltage sensing circuit;
a battery output current sensing circuit; and
processing circuitry coupled to the battery output voltage sensing circuit and the battery output current sensing circuit, the processing circuitry configured to obtain sensed battery output voltage values and sensed battery output current values at defined intervals and to estimate values for at least three battery state parameters of a plurality of battery state parameters at particular times when the battery is delivering power to the powertrain, wherein each of the at least three battery state parameters varies over time as the battery is used to drive the powertrain, the plurality of battery state parameters including an open circuit voltage ($V_{oc}$), a series resistance ($R_s$), a first resistance ($R_1$), a first capacitance ($C_1$), a second resistance ($R_2$), and a second capacitance ($C_2$), wherein estimating the at least three battery state parameters comprises concurrently fitting sensed battery output voltage values and sensed battery output current values and/or data derived from the sensed battery output voltage values and sensed battery output current values to at least two different equations, wherein each of the at least two different equations are defined at least in part by different subsets of the at least three battery state parameters.

18. The electric vehicle of claim 17, comprising powertrain control circuitry that is configured to receive the estimated battery state parameters and control the powertrain based at least in part on the estimated battery state parameters.

19. The electric vehicle of claim 17, wherein the processing circuitry is configured to estimate values of six of the plurality of battery state parameters using three linear equations, and wherein the three linear equations comprise:

$$(V_s) = R_s(I_b) + V_{oc} \quad (1)$$

$$\left(\frac{\int I_b}{V_1}\right) = \frac{1}{R_1}\left(\frac{\int V_1}{V_1}\right) + C_1 \quad (2)$$

$$\left(\frac{\int I_b}{V_2}\right) = \frac{1}{R_2}\left(\frac{\int V_2}{V_2}\right) + C_2, \quad (3)$$

wherein $R_s$, $V_{oc}$, $R_1$, $C_1$, $R_2$, and $C_2$ are components of a battery equivalent circuit, wherein $R_1$ and $C_1$ are components of a series RC circuit and $R_2$ and $C_2$ are components of a second series RC circuit and wherein equations (2) and (3) are solved over a predetermined sampling time interval.

20. The electric vehicle of claim 17, wherein the battery performance parameters comprise an open circuit voltage of a battery equivalent circuit, and wherein the processing circuitry is further configured to estimate a charge state of the battery pack based at least in part on the estimated open circuit voltage of the equivalent circuit.

21. The electric vehicle of claim 20, wherein the processing circuitry is further configured to calculate a vehicle range estimate and deliver the vehicle range estimate to a user of the vehicle on a display located within the vehicle.

22. The electric vehicle of claim 20, wherein the battery performance parameters further comprise at least one resistance and at least one capacitance of the battery equivalent circuit.

23. The electric vehicle of claim 22, wherein the processing circuitry is further configured to estimate an instantaneous power limit of the battery pack in real time based on the estimated battery state parameters.

24. The electric vehicle of claim 23, further comprising updating a pedal map of the electric vehicle based on the estimated instantaneous power limit.

25. The electric vehicle of claim 17, wherein the battery performance parameters comprise a series resistance of a battery equivalent circuit.

26. The electric vehicle of claim 25, wherein the processing circuitry is further configured to compare the series resistance to a predetermined threshold and notify a user of the vehicle that battery maintenance is necessary when the series resistance exceeds the predetermined threshold.

27. The battery powered apparatus of claim 1, wherein the processing circuitry does not include using an extended Kalman filter to estimate values for at least three battery state parameters.

* * * * *